March 18, 1969 S. K. TALLY ET AL 3,433,888
DIMENSIONALLY STABLE FLEXIBLE LAMINATE AND PRINTED CIRCUITS MADE THEREFROM
Filed Jan. 24, 1967
FIG. 1.
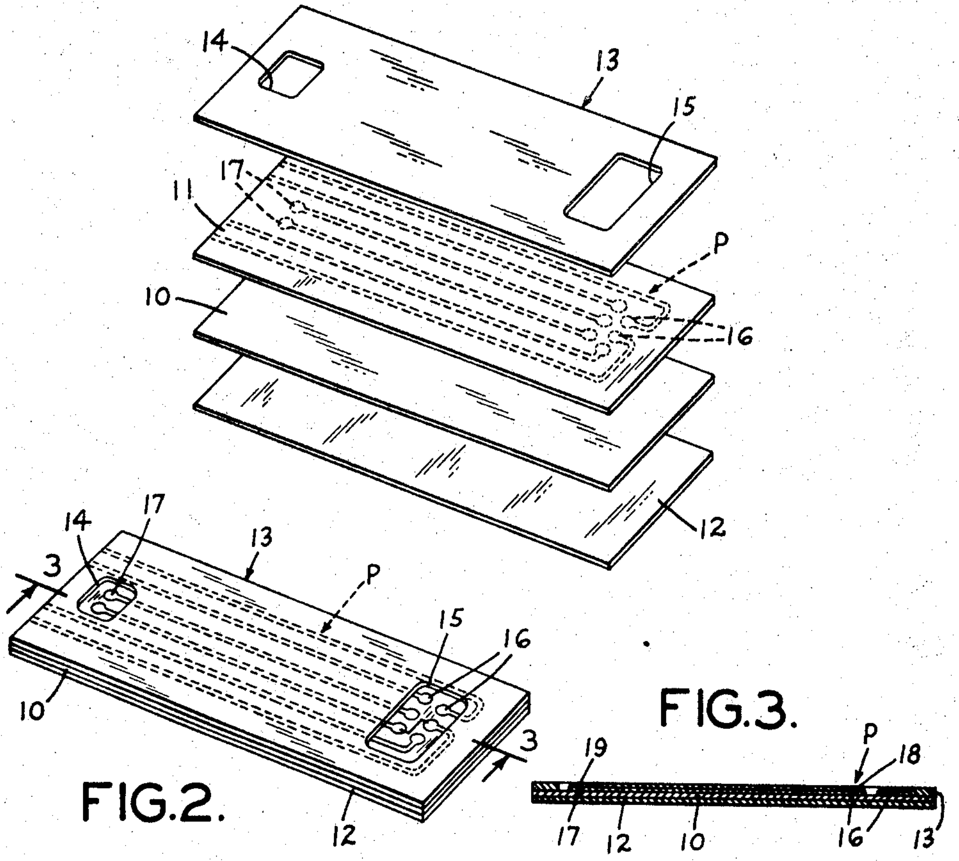
FIG. 2. FIG. 3.
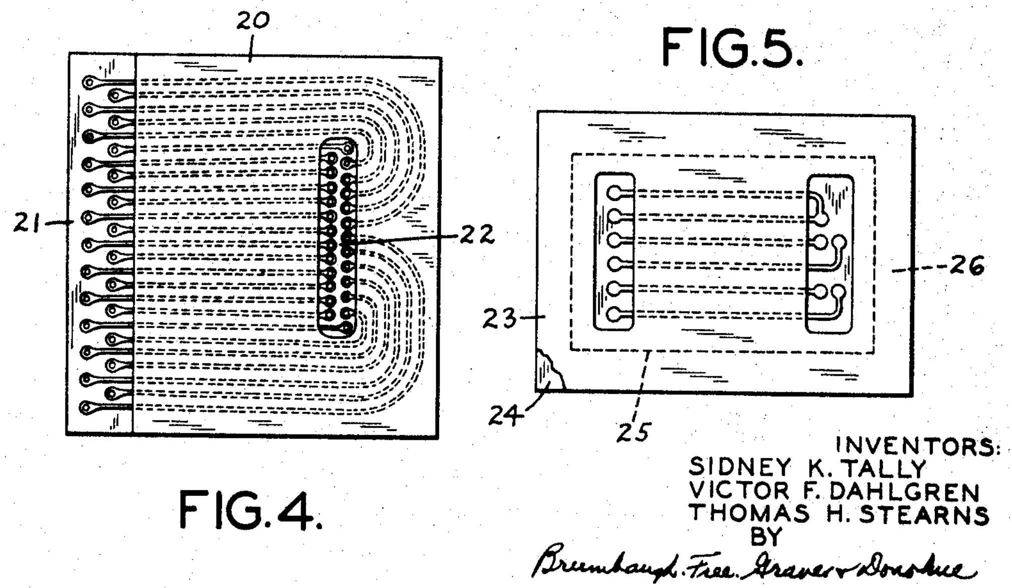
FIG. 4. FIG. 5.
INVENTORS:
SIDNEY K. TALLY
VICTOR F. DAHLGREN
THOMAS H. STEARNS
BY
Brumbaugh, Free, Graves & Donohue
THEIR ATTORNEYS

United States Patent Office 3,433,888

Patented Mar. 18, 1969

3,433,888

DIMENSIONALLY STABLE FLEXIBLE LAMINATE AND PRINTED CIRCUITS MADE THEREFROM

Sidney K. Tally, Nashua, N.H., Victor F. Dahlgren, Chelmsford, Mass., and Thomas H. Stearns, Amherst, N.H., assignors to Electro-Mechanisms, Inc., Methuen, Mass., a corporation of New Hampshire Filed Jan. 24, 1967, Ser. No. 611,289

U.S. Cl. 174—68.5 18 Claims

Int. Cl. H05k *1/00, 3/10*

ABSTRACT OF THE DISCLOSURE

This invention relates to flexible, dimensionally stable and damage-resistant laminates and printed circuits composed of conductive metallic foil bonded to a fabric coated with an epoxy resin, the fabric being bonded to and supported by a layer of a flexible thermoplastic resin, the printed circuits also having a layer of flexible thermoplastic resin overlying at least portions of the metallic foil conductors of the printed circuits.

Printed circuits for electrical and electronic equipment are well known and widely used in many fields. Generally, they may be divided into two groups, namely, rigid printed circuits and flexible printed circuits, although combined rigid and flexible units have been made heretofore.

In the rigid type of printed circuit, copper foil is bonded to a sheet of a stiff base material. After application of an appropriate resist to the copper foil and etching to produce a printed circuit, the printed circuit is either covered with an insulating layer of plastic or may be combined with other similar or different printed circuits to form a stacked circuit. These printed circuits cannot be bent to fit in constricted areas or to make necessary connections therewith. The stiff base material provides dimensional stability but no flexibility.

In flexible printed circuits, the copper foil is usually applied to a layer of flexible synthetic plastic material and after printing of a resist and etching can be encapsulated with another layer of a flexible plastic material. Usually both of the layers of plastic material are of thermoplastic nature to facilitate bonding. While these cables are flexible, they lack dimensional stability and as a consequence frequently shrink or can be stretched beyond tolerances, in the latter case sometimes breaking the thin copper foil conductors therein and damaging or destroying the printed circuit. Attempts have been made to obtain both dimensional stability and flexibility by utilizing a very thin plastic-impregnated glass fabric base for the foil or printed circuit, the plastic serving as an insulator and as a bonding agent. These products have dimensional stability but they are fragile and cannot withstand bending or tearing stresses.

In accordance with the present invention, we have provided laminates, printed circuits made of such laminates and methods of making laminates which have both dimensional stability and flexibility as well as high resistance to tearing, cracking on sharp bending and other forces tending to damage the printed circuit.

More particularly, in accordance with a preferred form of the present invention, laminates are made by assembling a layer of copper foil or other conductive metal foil on very thin glass fabric impregnated or coated with an uncured, non-tacky, epoxy resin which can be cured by heating to an elevated temperature and applying a layer of a flexible, resilient, fluorocarbon resin in the form of a thin film or layer to the side of the glass fabric opposite from the side bearing the copper foil. When the assembly of foil, epoxy-coated glass fabric and fluorocarbon resin is subjected to heat and pressure in a laminating press, the epoxy softens and then is cured and bonds the glass fabric to the copper foil and the resilient resin. The laminate so produced is highly flexible, can be twisted and bent and, in fact, folded and creased without fracturing the glass fabric or the copper foil and, at the same time, due to the presence of the glass fabric therein, is dimensionally stable, that is, it will not expand, contract or change dimensions to any appreciable extent.

This laminate can be subjected to the conventional operations for producing a printed circuit as by application of a resist to the copper foil and etching away the remainder of the foil to leave separate or interconnected conductors. Following the formation of the printed circuit, a complete or partial flexible insulating layer of suitable insulating material, for example a layer of fluorocarbon, may be applied to the copper circuitry to encapsulate it completely or to leave exposed portions to which connections are to be made.

Depending upon the requirements for the circuit and the laminate in service, a wide variety of resilient and flexible resins may be used for covering the glass fabric and the printed circuit thereon to impart the necessary flexibility and resistance to damage. For general utility including high temperature use, a synthetic resin of the fluorocarbon type, such as, for example, Teflon FEP, a product of E. I. du Pont de Nemours & Co. Inc., is especially suitable. Teflon FEP has excellent electrical properties, can withstand high temperatures, and has superior chemical properties as described more particularly in Du Pont Bulletins T–2B, T–3B and T–4B. Utilizing a fluorocarbon film as a cover layer, the portions of the printed circuit where connections are to be made can be left uncovered by cutting openings in the fluorocarbon film prior to laminating. The exposed circuit portions can be dip soldered, by immersing the laminate or the printed circuit in molten solder, or wave soldered. Both the fluorocarbon film and the epoxy resins are resistant to high temperatures and thus can withstand dip soldering temperatures without damage.

As an insulating medium for the printed circuit, other types of resins than fluorocarbons may also be used if the soldering treatments and the like are not as severe as those encountered in dip soldering. Thus, vinyl, polyethylene, polyamide, polyimide or polyurethane coatings can be applied as solutions of these resins by silk screening or as films to cover completely or partially the printed circuit. These elastomeric and thermoplastic materials may also be used instead of a fluorocarbon film as a supporting layer for the glass fabric. Elastomeric resins of the types mentioned offset the brittle characteristics of epoxy resin coated glass fabric and increase resistance to tearing of thin glass fabric which is quite fragile and is made even more susceptible to cracking by the presence of the epoxy coating thereon.

Instead of glass fabric as a stabilizing medium, other dimensionally stable materials can be used, for example paper, thin textile fabrics or even other dimensionally stable plastics, such as Du Pont "H" film, a polyimide of the Dacron type. However, for high temperature usage, glass fabric is superior to these other materials and laminates including epoxy coated glass fabric for reinforcement and stabilization have a much wider variety of applications than the other modifications described above.

For a better understanding of the present invention, reference may be had to the accompanying drawing, in which FIGURE 1 is an exploded perspective view of a printed circuit embodying the present invention;

FIGURE 2 is a perspective view of a completed printed circuit;

FIGURE 3 is a view in section taken on line 3—3 of FIGURE 2;

FIGURE 4 is a plan view of a modified form of printed circuit embodying the invention; and FIGURE 5 is a plan view of another type of printed circuit embodying the invention.

Referring now to the drawings, FIGURE 1 illustrates diagrammatically the layers of a typical printed circuit in accordance with the present invention. Layer 10 in a preferred embodiment of the invention may consist of a layer of glass fabric about two mils thick which has been coated and impregnated with a B stage epoxy resin. The resin may be of the bisphenol A and epichlorohydrin type containing an acid curing agent and dissolved in a suitable solvent, such as a mixture of toluene and isopropyl alcohol or toluene and methyl isobutyl ketone or the like. The Y663 thermosetting epoxy varnish manufactured by the Sterling Varnish Company has proved highly suitable. The thermosetting epoxy varnish can be applied to the glass fabric by brushing, spraying, roller coating or the like in a thin layer of uniform thickness. The coated fabric is subjected to a mild heating to drive off the solvent and, when dry, is non-tacky and non-adherent, i.e., dry to the touch, so that it can be handled without difficulty. The thermosetting epoxy compound is stable in its uncured state or B stage over prolonged periods of time but can be cured by subjecting it to temperatures on the order of 350° F. The thermosetting epoxy coated and impregnated glass fabric sheet is placed in a laminating press on top of a sheet of copper foil 11 about .0027 inch thick. The copper foil sheet is continuous and may cover the entire surface of the thermopoxy-glass fabric base 10. On top of the base 10 is applied a film 12 of a fluorocarbon such as Teflon FEP about two mils thick. The assembly is then laminated in the laminating press at a pressure of approximately 160 pounds per square inch and at a temperature of about 350° F. for forty minutes. The press may be provided with suitable metal carrier plates and a release sheet bearing against the fluorocarbon layer 12 to avoid sticking. While fluorocarbons such as Teflon FEP are non-adherent to many materials, they are bonded strongly to the glass fabric by the thermosetting epoxy resin during the curing of the resin. The laminate so produced is flexible, is resistant to cracking and tearing and even if stresses should be exerted, tending to tear the edges of the glass fabric, a thin film or web of the fluorocarbon remains between the torn edges of the glass fabric, and thus preserves the continuity of the material.

As explained above, an etching resist can be applied to the exposed copper foil 11 and the copper is etched with an appropriate etching agent in a known way to produce the printed circuit P shown in dotted lines in FIGURE 1 and full and dotted lines in FIGURE 2. Thereafter, the printed circuit P can be covered with another layer 13 of a fluorocarbon, such as Teflon FEP, having cutouts 14 and 15 therein in the areas where connections to other circuits are to be made. The cover layer 13 is laminated to the fabric base by the application of heat and pressure to form an encapsulated circuit of which only the connection pads 16 and 17 etc. are exposed. To facilitate bonding, a thin layer of a B stage epoxy resin, a polyurethane base adhesive or the like may be used to bond the cover layer to the fabric base and conductors. The finished printed circuit is sufficiently temperature-resistant that it can be dip soldered or wave soldered to apply, as shown in FIGURE 3, solder coatings 18 and 19 on the exposed portions of the conductors and connecting pads, to thereby facilitate the connection of the printed circuit to other conductors or other electrical components by means of a soldering iron or other similar technique. Temperatures as high as 500° F. can be withstood by the printed circuit laminate, enabling the use of high melting solders.

It will be understood that stacked circuits can also be made by laminating together a series of printed circuit units similar to those shown in FIGURE 2, and appropriate soldering or plating through techniques.

For less severe conditions of use, other resins may be used for the cover coat 13 and other methods may be used for applying such insulating cover coats to the printed circuit conductors 11. Thus, for example, as shown in FIGURE 4, the cover coat 20 may be applied by silk screening a solution of a resin in a solvent and heating the laminate to drive off the solvent. Solutions of a vinyl resin, a urethane resin or polyethylene are suitable for application to the surfaces of the conductors of the printed circuit and the exposed surface of the base 10 in any desired pattern and can either completely cover the printed circuit or leave one or more uncoated areas 21 and 22, as shown in FIGURE 4, to facilitate soldering or otherwise attaching conductors to the printed circuit. Usually no adhesive is required to bond these coatings to the fabric base and conductors. It is, of course, feasible to cover all of the printed circuit and then remove "divots" with a suitable coring tool in the areas overlying the portions of the conductors where connections are to be made by soldering, brazing or other techniques.

Tear and moisture resistance can be increased by extending the cover coats 23 and 24 beyond the perimeter of the glass fabric base layer 25 and the printed circuit thereon as shown in FIGURE 5 and laminating the edges of these cover coats directly together, in this way providing a relatively wide tear-resistant rim 26 around the edge of the base layer 25.

Likewise, stabilizing or reinforcing materials other than glass fabric are useful in laminates to be subjected to less severe conditions. For example, paper or natural or synthetic fiber fabrics or even dimensionally stable plastic films can be used as stabilizing and reinforcing media. In this way, products can be provided to satisfy a variety of different purposes and at prices commensurate with their field of use.

The cover films or layers 23 and 24 may be uncolored and transparent or one or both of the cover sheets may be colored to identify different circuits and facilitate their assembly.

Other modifications and changes can be made in the laminate and the products produced therefrom. In any event, products of the type described are highly flexible and can be bent and twisted during installation without cracking, tearing or breaking of the stabilizing base layer or the conductors thereon. When the laminate and printed circuits made therefrom are composed of epoxy coated glass fabric and fluorocarbon covering layers, the printed circuits can withstand temperatures up to 500° C. without damage thereto. Because of the versatility of the epoxy-glass fabric-fluorocarbon laminate, it is the preferred form of the invention. However, it should be understood that the specific example given herein is illustrative and should not be considered as limiting the scope of the invention as defined in the following claims.

We claim:

1. A laminate for printed circuits comprising a dimensionally stable layer of flexible non-conductive material, a layer of a conductive metal foil on one side of said stable layer and a layer of a flexible, thermoplastic and elastomeric synthetic resin on the other side of said stable layer, said stable layer, said foil layer and said layer of synthetic resin being bonded together with a cured thermosetting epoxy resin which is stable and non-tacky in an uncured state and cures at an elevated temperature.

2. The laminate set forth in claim 1 in which said elastomeric synthetic resin is a fluorocarbon.

3. The laminate set forth in claim 2 in which said foil comprises a plurality of conductors and further includes a cover layer of an elastomeric synthetic resin overlying said conductors and bonded to said layer of dimensionally stable material.

4. The laminate set forth in claim 1 in which said synthetic resin is a vinyl resin.

5. The laminate set forth in claim 4 in which said foil comprises a plurality of conductors and further includes a cover layer of an elastomeric synthetic resin overlying said conductors and bonded to said layer of dimensionally stable material.

6. The laminate set forth in claim 1 in which said synthetic resin is a urethane resin.

7. The laminate set forth in claim 1 in which said synthetic resin is polyethylene.

8. The laminate set forth in claim 7 in which said foil comprises a plurality of conductors and further includes a cover layer of an elastomeric synthetic resin overlying said conductors and bonded to said layer of dimensionally stable material.

9. The laminate set forth in claim 1 in which said non-conductive material is a glass fabric.

10. The laminate set forth in claim 9 in which said foil comprises a plurality of conductors and further includes a cover layer of an elastomeric synthetic resin overlying said conductors and bonded to said layer of glass fabric.

11. The laminate set forth in claim 1 in which said non-conductive material is a natural fiber fabric.

12. The laminate set forth in claim 11 in which said foil comprises a plurality of conductors and further includes a cover layer of an elastomeric synthetic resin overlying said conductors and bonded to said layer of natural fiber fabric.

13. The laminate set forth in claim 1 in which said non-conductive material is a dimensionally stable synthetic resin film.

14. The laminate set forth in claim 13 in which said foil comprises a plurality of conductors and further includes a cover layer of an elastomeric synthetic resin overlying said conductors and bonded to said layer of dimensionally stable synthetic resin film.

15. The laminate set forth in claim 1 in which said non-conductive material is a glass fabric about 2 mils thick and said synthetic resin is a fluorocarbon.

16. The laminate set forth in claim 15 in which said foil comprises a plurality of conductors and further includes a cover layer of an elastomeric synthetic resin overlying said conductors and bonded to said layer of glass fabric.

17. The laminate set forth in claim 1 in which said foil comprises a plurality of conductors and further includes a cover layer of an elastomeric synthetic resin overlying said conductors and bonded to said layer of dimensionally stable material.

18. The laminate set forth in claim 17 in which said synthetic resin of said cover layer is a fluorocarbon.

References Cited

UNITED STATES PATENTS

| | | | |
|---|---|---|---|
| 2,955,974 | 10/1960 | Allen et al. | 174—68.5 |
| 3,052,823 | 9/1962 | Anderson et al. | 174—68.5 |

DARRELL L. CLAY, *Primary Examiner.*

U.S. Cl. X.R.

339—17; 161—165, 190, 196, 216; 174—52